(12) United States Patent
Tseng et al.

(10) Patent No.: US 12,058,832 B2
(45) Date of Patent: Aug. 6, 2024

(54) CHASSIS QUICK RELEASE DEVICE

(71) Applicant: HANWIT PRECISION INDUSTRIES LTD., New Taipei (TW)

(72) Inventors: Ying-Chih Tseng, New Taipei (TW); Ming-De Wu, New Taipei (TW); Ching-Kai Chang, New Taipei (TW)

(73) Assignee: HANWIT PRECISION INDUSTRIES LTD., New Taipei (TW)

( * ) Notice: Subject to any disclaimer, the term of this patent is extended or adjusted under 35 U.S.C. 154(b) by 0 days.

(21) Appl. No.: 18/311,840

(22) Filed: May 3, 2023

(65) Prior Publication Data

US 2024/0081017 A1 Mar. 7, 2024

(30) Foreign Application Priority Data

Sep. 2, 2022 (TW) .................................. 111133434

(51) Int. Cl.
*H05K 7/14* (2006.01)
*A47B 57/50* (2006.01)

(52) U.S. Cl.
CPC ........... *H05K 7/1488* (2013.01); *A47B 57/50* (2013.01)

(58) Field of Classification Search
CPC ......... A47B 57/30; A47B 57/32; A47B 57/34; A47B 57/40; A47B 57/402; A47B 57/404; A47B 57/406; A47B 57/408; A47B 57/42; A47B 57/425; A47B 57/44; A47B 57/46; A47B 57/48; A47B 57/482; A47B 57/485; A47B 57/487; A47B 57/50; A47B 57/52; A47B 57/54; A47B 57/545; A47B 57/56; A47B 57/562; A47B 57/565; A47B 57/567; A47B 88/407; A47B 88/938; A47B 2088/94; A47B 2088/939; H05K 7/1485; H05K 7/1488; H05K 7/1489; H05K 7/1491; H05K 7/1492; H05K 7/1494; H05K 7/1495; H05K 7/18; H05K 7/183; H05K 7/186
USPC ........................................................ 211/187
See application file for complete search history.

(56) References Cited

U.S. PATENT DOCUMENTS

| | | | | |
|---|---|---|---|---|
| 9,723,745 B2 * | 8/2017 | Qi | ............................. | G06F 1/18 |
| 9,795,052 B2 * | 10/2017 | Hsiao | ....................... | H05K 7/18 |
| 9,877,407 B1 * | 1/2018 | Sim | ......................... | H04Q 1/06 |
| 10,765,028 B1 * | 9/2020 | Beall | .................... | H05K 7/1489 |
| 11,659,680 B2 * | 5/2023 | Lu | ........................ | H05K 7/1489 |
| | | | | 361/679.02 |

(Continued)

*Primary Examiner* — Joshua E Rodden
(74) *Attorney, Agent, or Firm* — MUNCY, GEISSLER, OLDS & LOWE, PC

(57) ABSTRACT

A chassis quick release device includes a housing including a base provided with a sliding channel, a compression space, and accommodating space, a rotating space and a shaft in the rotating space and covered with a cover, a locking block linearly movably set in the accommodating space and providing a guide groove, a guide chamber, a receiving groove and an elastic member set in the receiving groove, a locking member having a shaft hole coupled to the shaft, a rotary reset member positioned on the shaft, resisting edge located at one end thereof that can rotate and protrude from the housing and a locking edge located at the other end thereof, and an operating handle including a rod body positioned in the sliding channel, the guide groove and the guide chamber and mounted with a grp and having a locking portion stopped against the guide chamber.

10 Claims, 13 Drawing Sheets

(56) References Cited

U.S. PATENT DOCUMENTS

| | | | | |
|---|---|---|---|---|
| 2013/0241377 | A1* | 9/2013 | Zhang | G06F 1/181 |
| | | | | 403/188 |
| 2014/0001314 | A1* | 1/2014 | Gong | H05K 7/1491 |
| | | | | 248/49 |
| 2016/0345453 | A1* | 11/2016 | Zhang | H05K 5/0234 |
| 2018/0228049 | A1* | 8/2018 | Liao | A47B 88/477 |
| 2023/0345660 | A1* | 10/2023 | Chen | H05K 7/1489 |
| 2024/0081017 | A1* | 3/2024 | Tseng | H05K 7/1488 |

\* cited by examiner

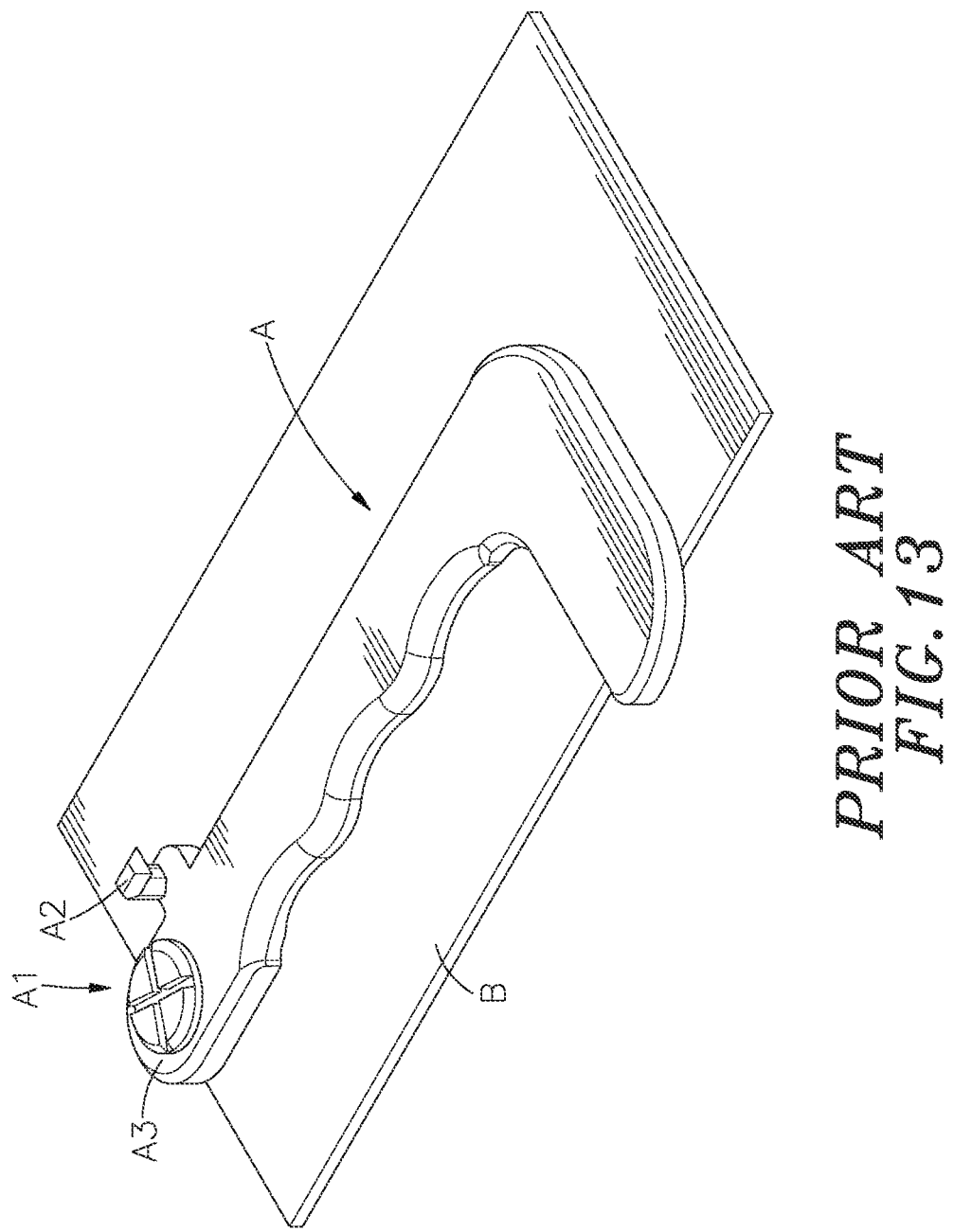

CHASSIS QUICK RELEASE DEVICE

This application claims the priority benefit of Taiwan patent application number 111133434, filed on Sep. 2, 2022.

BACKGROUND OF THE INVENTION

1. Field of the Invention

The present invention provides a chassis quick release device, especially a quick release positioning structure arranged between the server chassis and the cabinet, so as to achieve the purpose of quick disassembly, assembly and easy operation.

2. Description of the Related Art

With the vigorous development of electronic technology, automatic control through electronic technology and computer systems can lead people to convenient, comfortable, fast and other high-efficiency functions in life and work. In addition to general personal use, computers can also be managed and controlled through a central integrated system. For example: industrial computer room, central management and control system of buildings, central management and control system of automatic plant operation system, central processing and control system of audio, video and video broadcasting, etc., are all connected to multiple computer hosts, servers, and operation conversion systems at the same time through centralized management. Chassis are assembled in a large server cabinet by stacking, and the chassis can be pulled or pushed outward from the side of the cabinet for assembly of various computer operating systems or hardware maintenance. Because the server needs to combine multiple operating host systems, when various computer operating systems need to perform related operations, such as testing and updating programs, chassis of different layers and positions must be pulled out of the cabinet one by one to facilitate testing or related maintenance work. When many stacked chassis are assembled in the cabinet, there is a quick-release buckle structure to position the chassis in the cabinet. Please refer to FIGS. 12 and 13 for the buckle structure currently used. The buckle structure of the conventional cabinet is to use the movable handle A2 to lock the internal screw hole B11 of the cylinder Bl of the combined object B with the locking element A1, so that the movable handle A can use the cylinder Bl on the combined object B to rotate, swing. Through the buckle A2 on the movable handle A, the purpose of locking is achieved, but there are still many inconveniences and deficiencies in actual assembly and application, such as:

1. After the movable handle A is moved to the position, the buckle is formed through the buckle A2, and the position is positioned, the movable handle A is not positioned. As long as it is slightly affected by an external force, it is quite easy to loosen, causing the buckle A2 to unbuckle.

2. The movable handle A is set outside the cylinder Bl through the straight hole A31 of the pivot joint A3 on one side, and then locked in the inner screw hole B11 of the cylinder Bl by means of the locking element A1, then the movable handle A belongs to the method of movable sleeve on the cylinder Bl, and it is easy to cause the chassis to loosen and slip in the cabinet.

Therefore, how to solve the problem that the movable handle of the conventional chassis is not smooth when performing maintenance work, and affects the defect and trouble that the internal chassis of the cabinet equipped with a computer operating system is prone to loosening, is the direction that relevant manufacturers engaged in this industry are eager to study and improve.

SUMMARY OF THE INVENTION

Therefore, in view of the above-mentioned problems and deficiencies, the inventor collected relevant information, and after various evaluations and considerations, the invention of this chassis quick release device was designed and born.

The main object of the present invention is to provide a chassis quick release device, comprising a housing, a locking block, a locking member and an operating handle. The housing comprises a base and a cover. A sliding channel, a compression space, an accommodating space and a rotating space are recessed in the base, and a shaft is protruded in the rotating space. The locking block is combined in the accommodating space and can move linearly. A guide groove and a guide chamber communicated with each other are provided in the locking block, and a receiving groove for accommodating at least one elastic member is provided in the locking block. The locking member has a shaft hole therein sleeved on the shaft and positioned, and the locking member is provided with a rotary reset member also positioned on the shaft. One end of the locking member is formed with a resisting edge that can rotatably protrude from the housing, and a locking edge is formed at the other end of the locking member opposite to the resisting edge. The operating handle comprises a rod body positioned on the sliding channel, the guide groove and the guide chamber. The rod body abuts against the guide chamber to form a corresponding locking portion, and the rod body is assembled with a grip away from the locking portion. When the operating handle is moved towards the housing, the locking portion partially moves out of the guide chamber and enters the rotating space, and the locking block slides out from the accommodating space under the thrust of the elastic member to form a locked state. In addition, when the operating handle is pulled away from the housing, the locking portion is pushed into the guide chamber and presses down on the locking block and compresses the elastic member to form an unlocked state. The aforementioned mechanism and action are used as a quick release positioning structure between the server chassis and the cabinet to achieve the purpose of quick disassembly, assembly and easy operation.

It is another object of the present invention to provide a chassis quick release device, wherein the compression space of the base is further provided with a resisting wall for resisting one end of at least one linear reset member. The other end of the linear reset member is held against a resisting plate radially extending from the rod body to provide a reset force for the operating handle to move toward the housing. The linear reset member refers to a spring.

It is still another object of the present invention to provide a chassis quick release device, wherein the locking block has at least one rail portion extending on opposite sides perpendicular to the guide groove. The accommodating space of the base is provided with at least one sliding groove corresponding to the rail portion, so that the locking block can slide linearly in the accommodating space of the base through the rail portion.

It is still another object of the present invention to provide a chassis quick release device, wherein the opening of the receiving groove where the locking block accommodates the elastic member is further provided with a positioning member for one end of the elastic member to be sleeved. The side of the positioning member away from the elastic member is held against the inner side of the cover. The other end of the elastic member is stopped against the bottom side wall of the receiving groove.

It is still another object of the present invention to provide a chassis quick release device, wherein the guide chamber of the locking block is a double triangular space with a larger interior and a smaller exterior, and the guide chamber is further formed with a U-shaped slope at the bottom of the corresponding external triangle. The locking portion accommodated in the guide chamber is correspondingly formed in a U-shaped structure, and the two side walls are in a triangular structure, and an abutting edge is formed at each of the two triangular side walls where the two triangular side walls contact the slope. Between the two abutting edges is formed an abutting bump contacting the inner triangular bottom of the guide chamber. One of the two side walls that is close to the locking edge of the locking member forms a locking surface.

It is still another object of the present invention to provide a chassis quick release device, wherein the rod body of the operating handle corresponding to the grip is provided with a cylindrical joint with a shaft groove inside. A protruding annular piece is formed at the cylindrical joint and a stepped positioning block is formed on the annular piece. The grip corresponding to the cylindrical joint is provided with a sleeve with an accommodating cavity inside. The sleeve has a first positioning groove and a second positioning groove engaged with the positioning block, and two interference protrusions are arranged between the first positioning groove and the second positioning groove. Through the above-mentioned structure, the grip can generate rotation and steering on the rod body. A wavy operating portion extends from the sleeve, and on the top side of the operating portion is provided a through groove for accommodating the head of an axle and communicating with the accommodating cavity. The top side of the head is recessed with an actuation slot for a preset hand tool to be inserted to adjust locking or unlocking. The positioning rod extending from the side of the head of the axle extends into and engages in the shaft groove for a fixation.

It is still another object of the present invention to provide a chassis quick release device, wherein between the cylindrical joint and the locking portion of the rod body is formed a rail plate extending into the sliding channel, the guide groove and the guide chamber for positioning and moving.

BRIEF DESCRIPTION OF THE DRAWINGS

FIG. 13 is the structural diagram of the buckle structure of the conventional cabinet after assembly.

DETAILED DESCRIPTION OF THE PREFERRED EMBODIMENT

In order to achieve the above-mentioned purpose and effect, the technical means and structure adopted by the present invention are hereby drawn to describe in detail the features and functions of the preferred embodiments of the present invention as follows, so as to facilitate a complete understanding.

Figure 1:
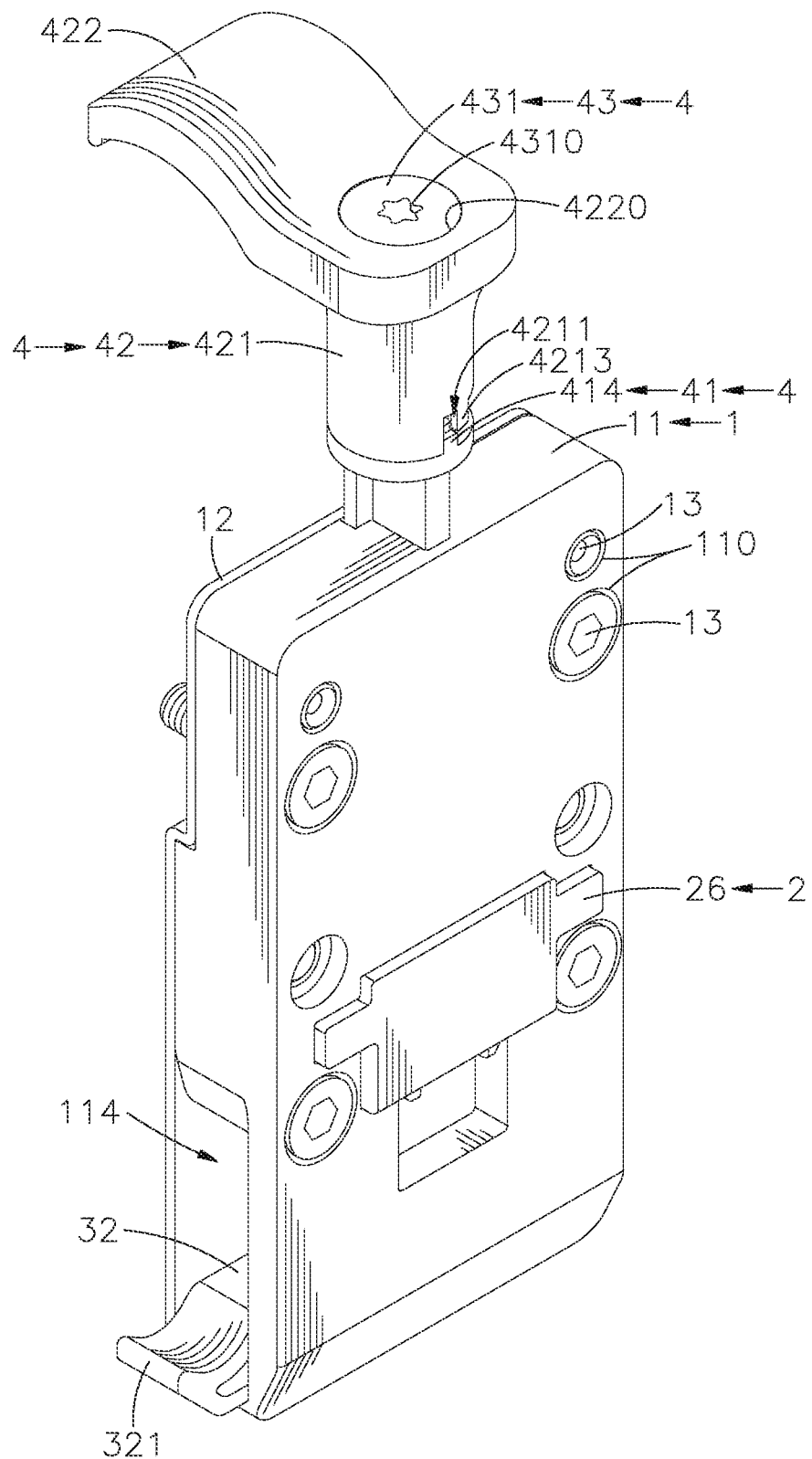
FIG. 1 is a perspective view of the present invention in an unlocked and shifted state.
Figure 2:
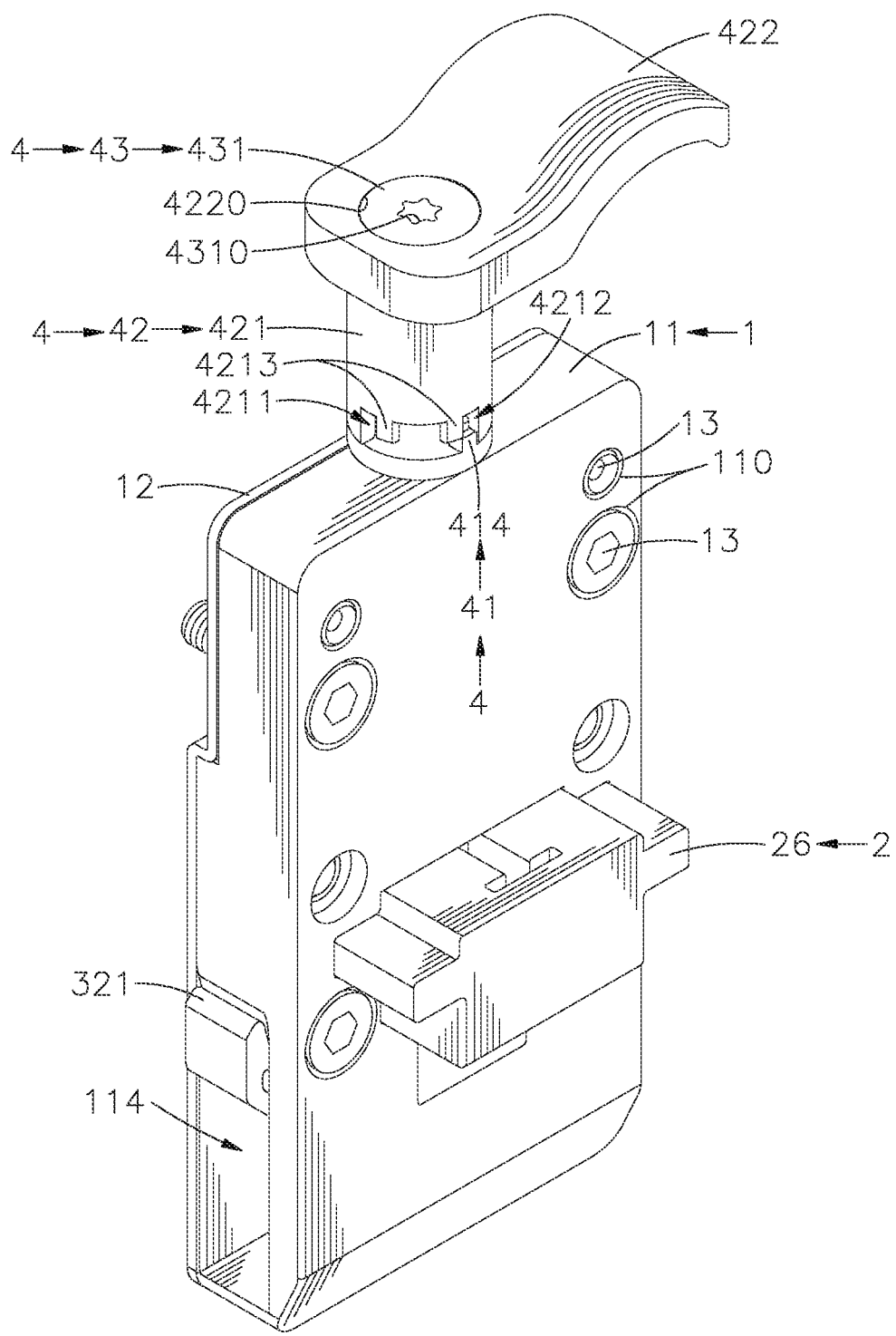
FIG. 2 is a perspective view of the present invention in a locked state.
Figure 3:
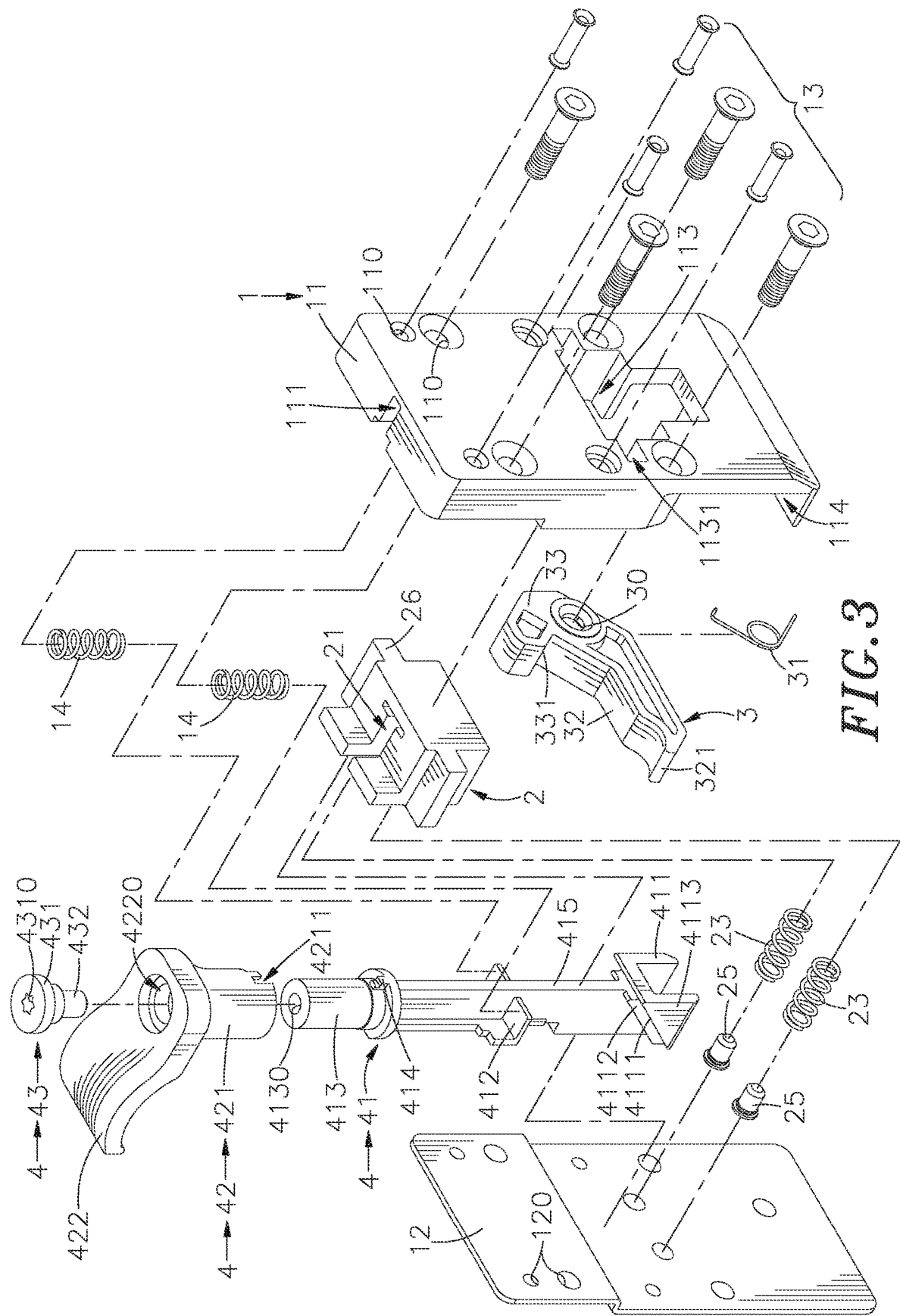
FIG. 3 is a three-dimensional exploded view of the present invention.
Figure 4:
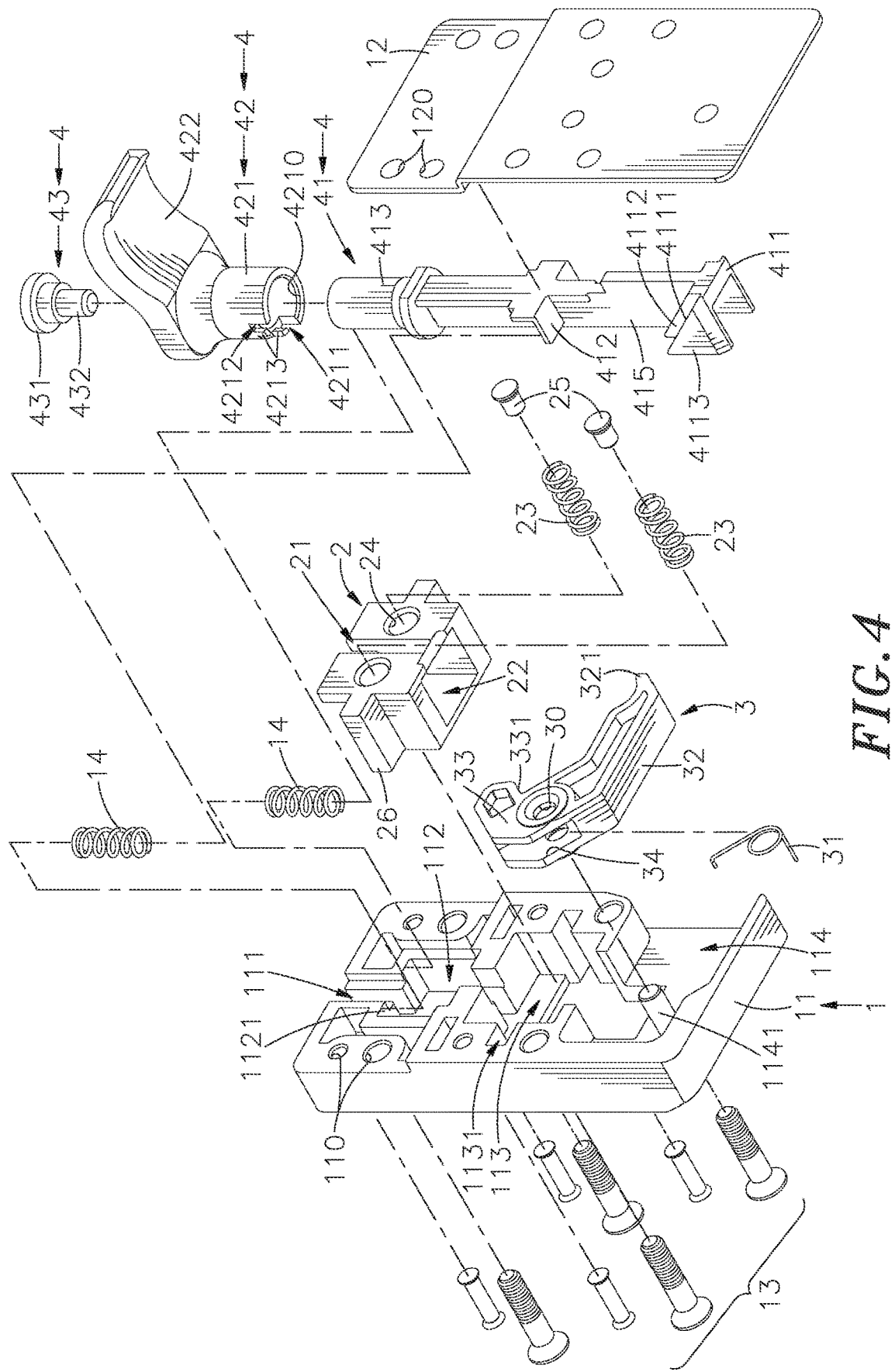
FIG. 4 is a three-dimensional exploded view of another perspective of the present invention.

Please refer to FIGS. 1 to 4, where FIG. 1 is a perspective view of the present invention in an unlocked and shifted state, FIG. 2 is a perspective view of the present invention in a locked state, FIG. 3 is a three-dimensional exploded view of the present invention, and FIG. 4 is a three-dimensional exploded view of another perspective of the present invention. It can be clearly seen from the drawings that the chassis quick release device of the present invention comprises: a housing 1, a locking block 2, a locking member 3 and an operating handle 4, and its main components and features are described in detail as follows:

The housing 1 comprises a base 11 and a cover 12 that can be combined with each other. A sliding channel 111, a compression space 112, an accommodating space 113 and a rotating space 114 are recessed in the base 11, and a shaft 1141 is protruded in the rotating space 114.

The locking block 2 is combined in the hollow accommodating space 113 and can move linearly. A guide groove 21 and a guide chamber 22 communicated with each other are provided in the locking block 2, and a receiving groove 24 for accommodating at least one elastic member 23 is provided in the locking block 2.

The locking member 3 has a shaft hole 30 therein sleeved on the shaft 1141 and positioned, and the locking member 3 is provided with a rotary reset member 31 also positioned on the shaft 1141. One end of the locking member 3 is formed with a resisting edge 321 that can rotatably protrude from the housing 1, and a locking edge 331 is formed at the other end of the locking member 3 opposite to the resisting edge 321.

The operating handle 4 comprises a rod body 41 positioned on the sliding channel 111, the guide groove 21 and the guide chamber 22. The rod body 41 abuts against the guide chamber 22 to form a corresponding locking portion 411, and the rod body 41 is assembled with a grip 42 away from the locking portion 411. When the operating handle 4 is moved towards the housing 1, the locking portion 411 partially moves out of the guide chamber 22 and enters the rotating space 114, and the locking block 2 slides out from the accommodating space 113 under the thrust of the elastic member 23 to form a locked state. In addition, when the operating handle 4 is pulled away from the housing 1, the locking portion 411 is pushed into the guide chamber 22 and presses down on the locking block 2 and compresses the elastic member 23 to form an unlocked state.

The base 11 is provided with a plurality of perforations 110 and the cover 12 is provided with a plurality of locking holes 120. The perforations 110 and the locking holes 120 are used for a plurality of fasteners 13 composed of a plurality of screws and a plurality of rivets to be penetrated and locked, and these screws are further locked into screw grooves of a predetermined chassis 5 (not shown) to make a fix. The compression space 112 of the base 11 is further provided with a resisting wall 1121 for resisting one end of at least one linear reset member 14. The other end of the linear reset member 14 is held against a resisting plate 412 radially extending from the rod body 41 to provide a reset force for the operating handle 4 to move toward the housing 1. The linear reset member 14 refers to a spring.

The opening of the receiving groove 24 where the locking block 2 accommodates the elastic member 23 is further provided with a positioning member 25 for one end of the elastic member 23 to be sleeved. The side of the positioning member 25 away from the elastic member 23 is held against the inner side of the cover 12. The other end of the elastic member 23 is stopped against the bottom side wall of the receiving groove 24. The locking block 2 has at least one rail portion 26 extending on opposite sides perpendicular to the guide groove 21. The accommodating space 113 of the base 11 is provided with at least one sliding groove 1131 corresponding to the rail portion 26, so that the locking block 2 can slide linearly in the accommodating space 113 of the base 11 through the rail portion 26.

Figure 5:
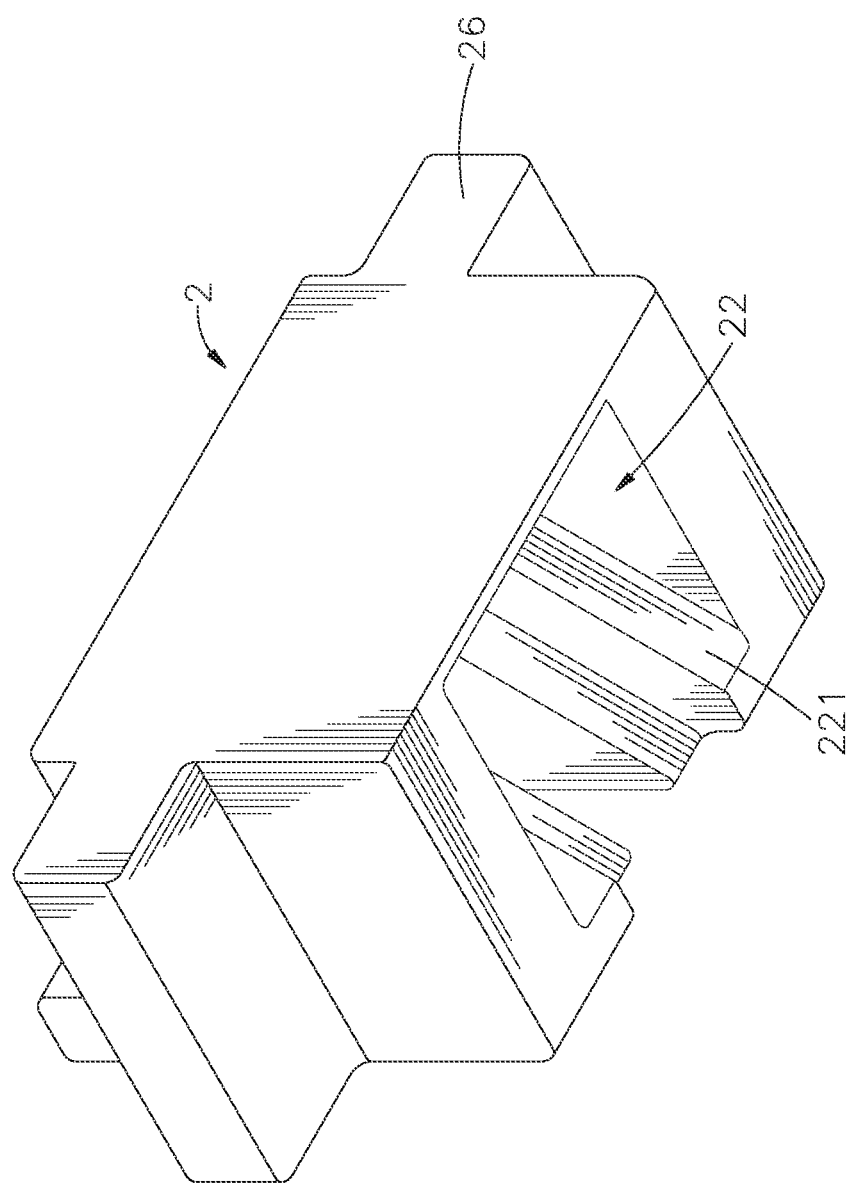
FIG. 5 is a three-dimensional structure diagram of the locking block of the present invention.
Figure 8:
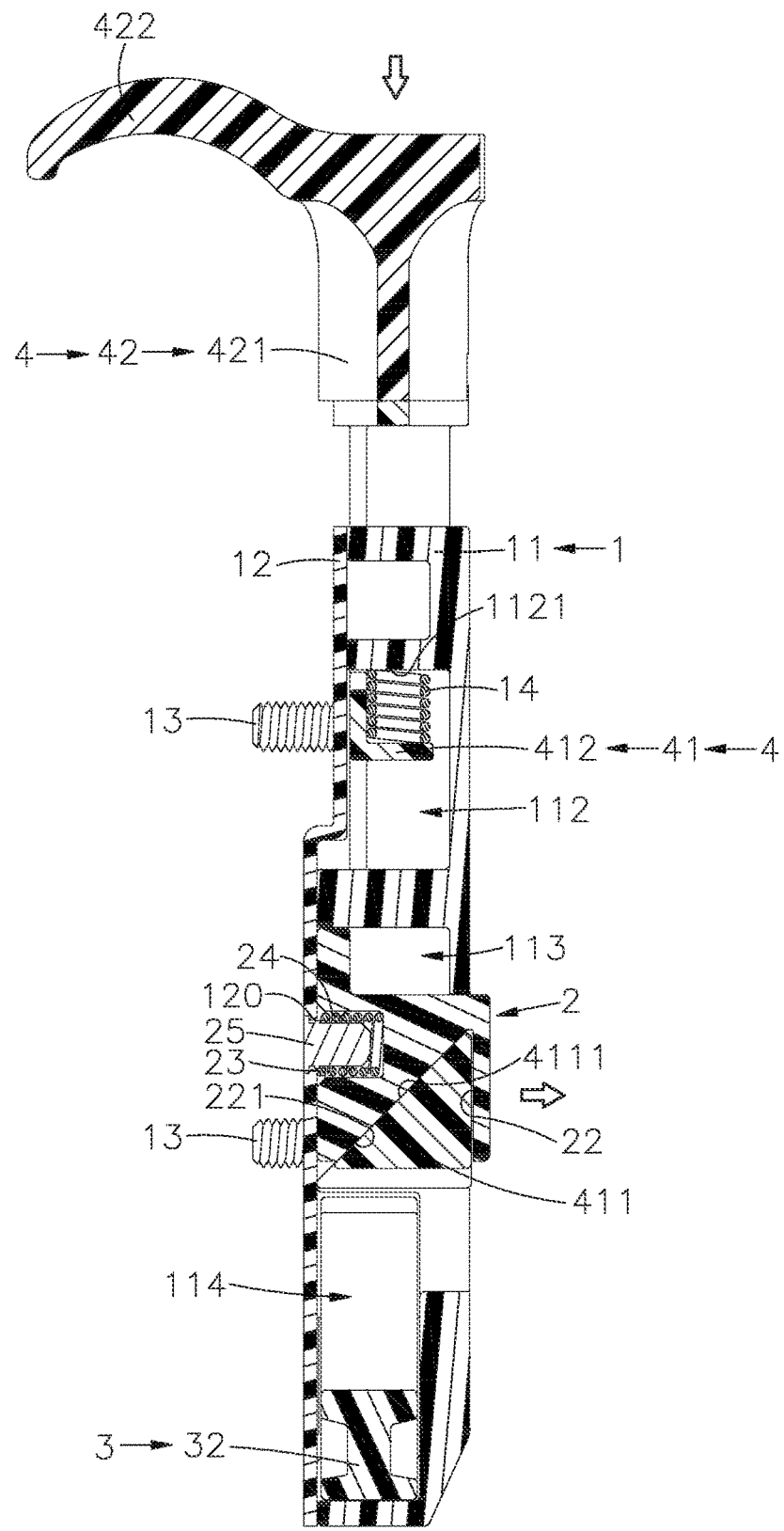
FIG. 8 is another side sectional view of the present invention in an unlocked and shifted state.

Please refer to FIGS. 5 and 8, the guide chamber 22 of the above-mentioned locking block 2 is a double triangular space with a larger interior and a smaller exterior, and the guide chamber 22 is further formed with a U-shaped slope 221 at the bottom of the corresponding external triangle. The locking portion 411 accommodated in the guide chamber 22 is correspondingly formed in a U-shaped structure, and the two side walls are in a triangular structure, and an abutting edge 4111 is formed at each of the two triangular side walls where the two triangular side walls contact the slope 221. Between the two abutting edges 4111 is formed an abutting bump 4112 contacting the inner triangular bottom of the guide chamber 22. One of the two side walls that is close to the locking edge 331 of the locking member 3 forms a locking surface 4113.

A large swing arm 32 with multiple turns is formed between the shaft hole 30 and the resisting edge 321 of the locking member 3. A small swing arm 33 with multiple turns is formed between the shaft hole 30 and the locking edge 331. The locking edge 331 is located inside the turning of the small swing arm 33. The rotary reset member 31 refers to a torsion spring and is accommodated in the storage chamber 34 which divides the shaft hole 30 into two in the locking member 3, and the center of the torsion spring is used for the shaft 1141 to pass through. One end of the torsion spring is against the inner wall of the storage chamber 34 and the other end is against the inner wall of the rotating space 114.

The rod body 41 of the above-mentioned operating handle 4 corresponding to the grip 42 is provided with a cylindrical joint 413 with a shaft groove 4130 inside. A protruding annular piece is formed at the cylindrical joint 413 and a stepped positioning block 414 is formed on the annular piece. The grip 42 corresponding to the cylindrical joint 413 is provided with a sleeve 421 with an accommodating cavity 4210 inside. The sleeve 421 has a first positioning groove 4211 and a second positioning groove 4212 engaged with the positioning block 414, and two interference protrusions 4213 are arranged between the first positioning groove 4211 and the second positioning groove 4212. Through the above-mentioned structure, the grip 42 can generate rotation and steering on the rod body 41. A wavy operating portion 422 extends from the sleeve 421, and on the top side of the operating portion 422 is provided a through groove 4220 for accommodating the head 431 of an axle 43 and communicating with the accommodating cavity 4210. The top side of the head 431 is recessed with an actuation slot 4310 for a preset hand tool (not shown) to be inserted to adjust locking or unlocking. The positioning rod 432 extending from the side of the head 431 of the axle 43 extends into and engages in the shaft groove 4130 for a fixation. Between the cylindrical joint 413 and the locking portion 411 of the rod body 41 is formed a rail plate 415 extending into the sliding channel 111, the guide groove 21 and the guide chamber 22 for positioning and moving.

When assembling the chassis quick release device of the present invention, first place the locking member 3 with the assembled rotary reset member 31 on the shaft 1141 of the base 11 to form a position, then set the locking block 2 with the loaded elastic member 23 in the accommodating space 113 by positioning the two rail portions 26 into the two sliding grooves 1131 respectively, and then assemble the rod body 41 of the operating handle 4 on the sliding channel 111, the guide groove 21 and the guide chamber 22 to expose the grip 42 of the operating handle 4 to the base 11, and finally, aim the locking holes 120 of the cover 12 at the respective perforations 110 of the base 11, and mount and lock the plurality of fasteners composed of plural screws and plural rivets to complete the assembly of the chassis quick release device.

Figure 6:
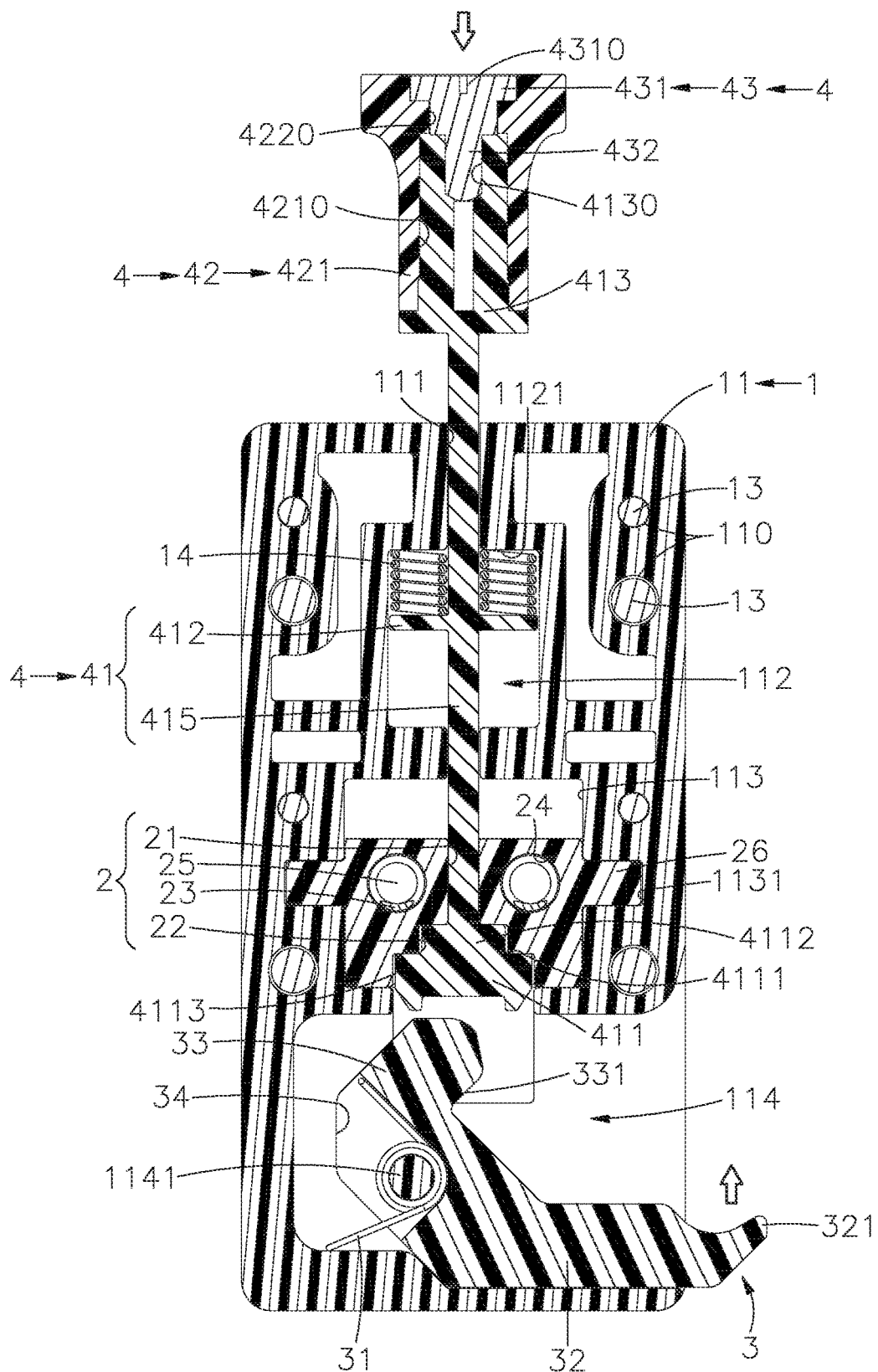
FIG. 6 is a side sectional view of the present invention in an unlocked and shifted state.
Figure 7:
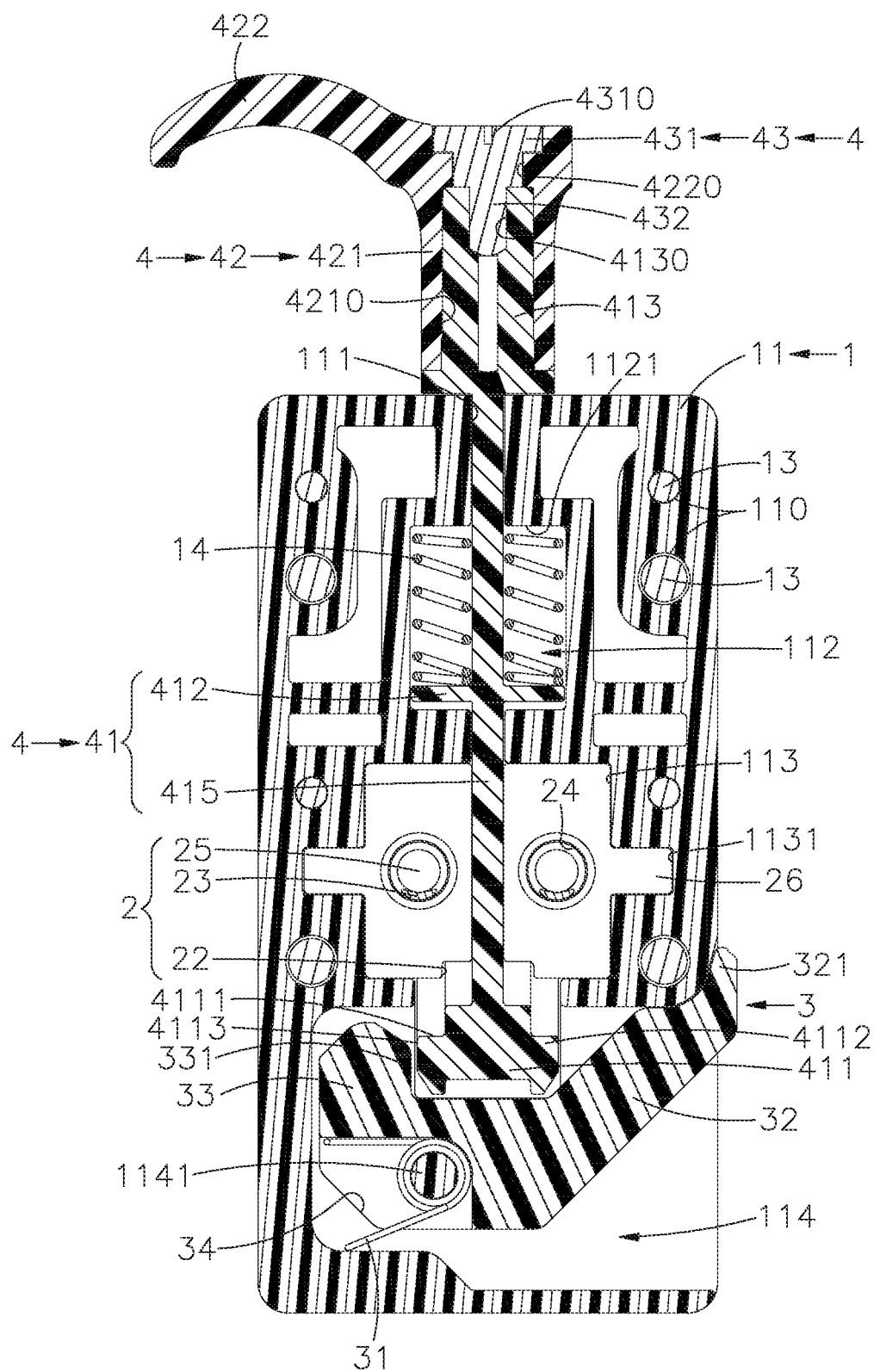
FIG. 7 is a side sectional view of the present invention in a locked state.
Figure 9:
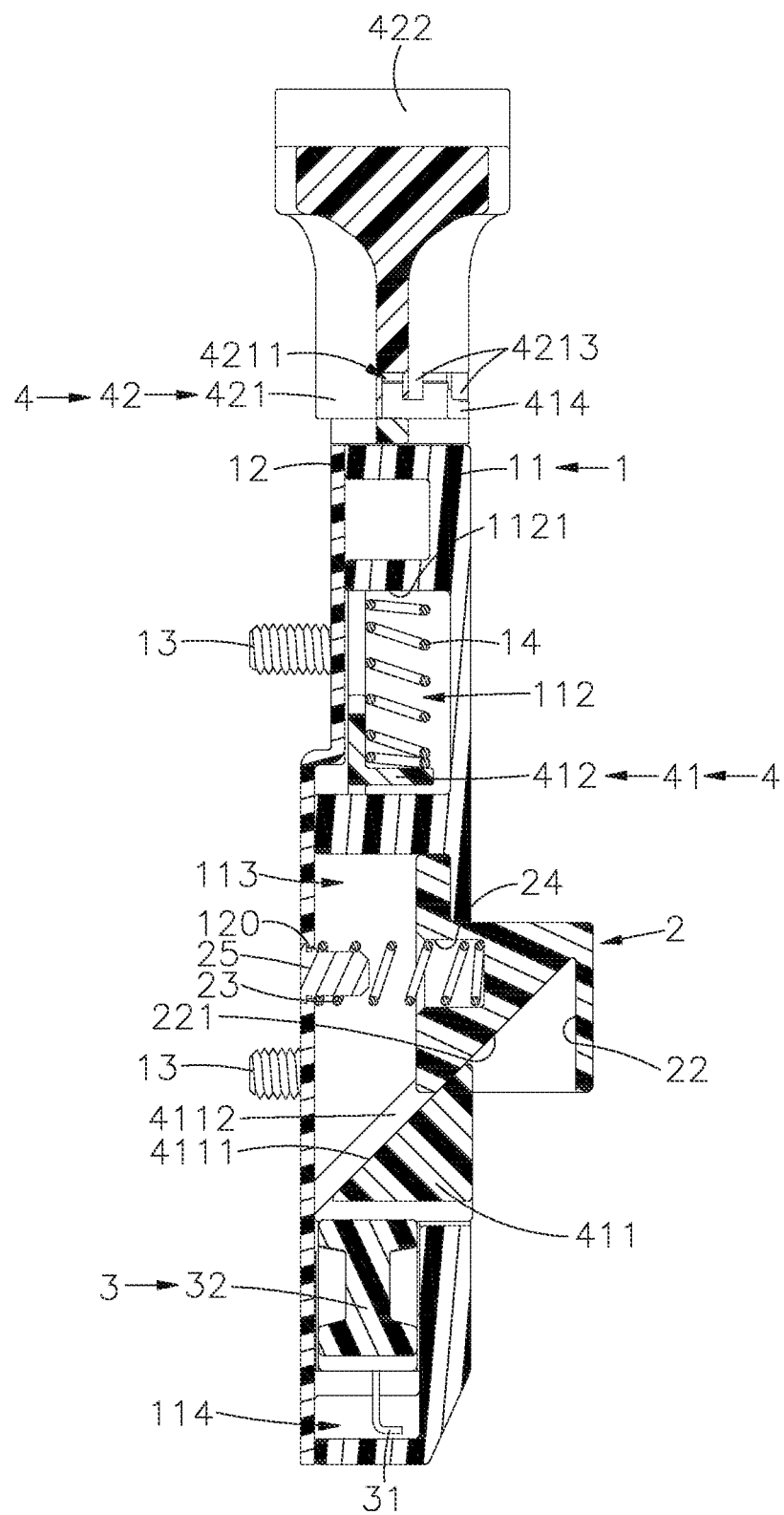
FIG. 9 is another side sectional view of the present invention in a locked state.
Figure 10:
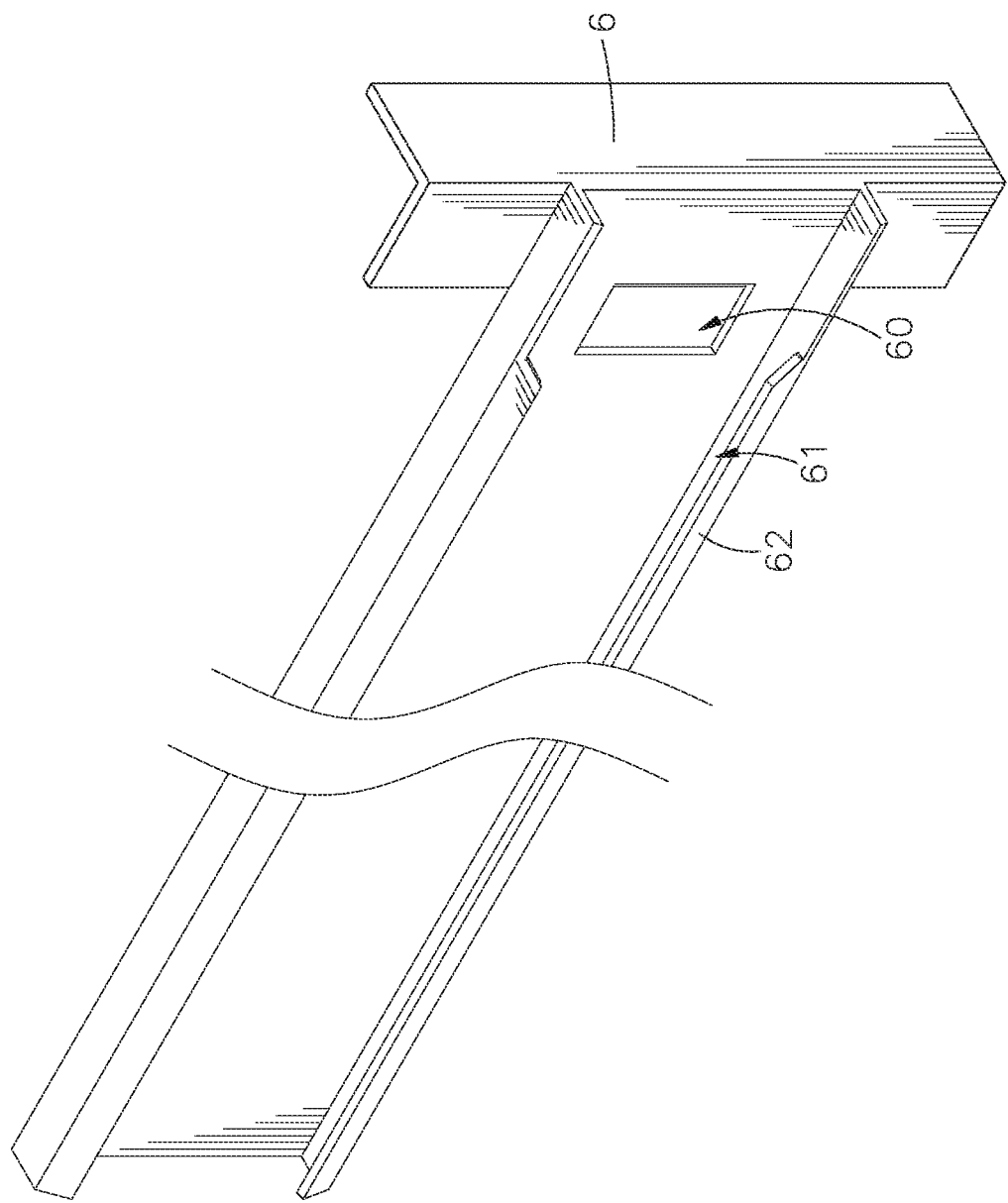
FIG. 10 is a three-dimensional schematic view of the cabinet of the present invention.
Figure 11:
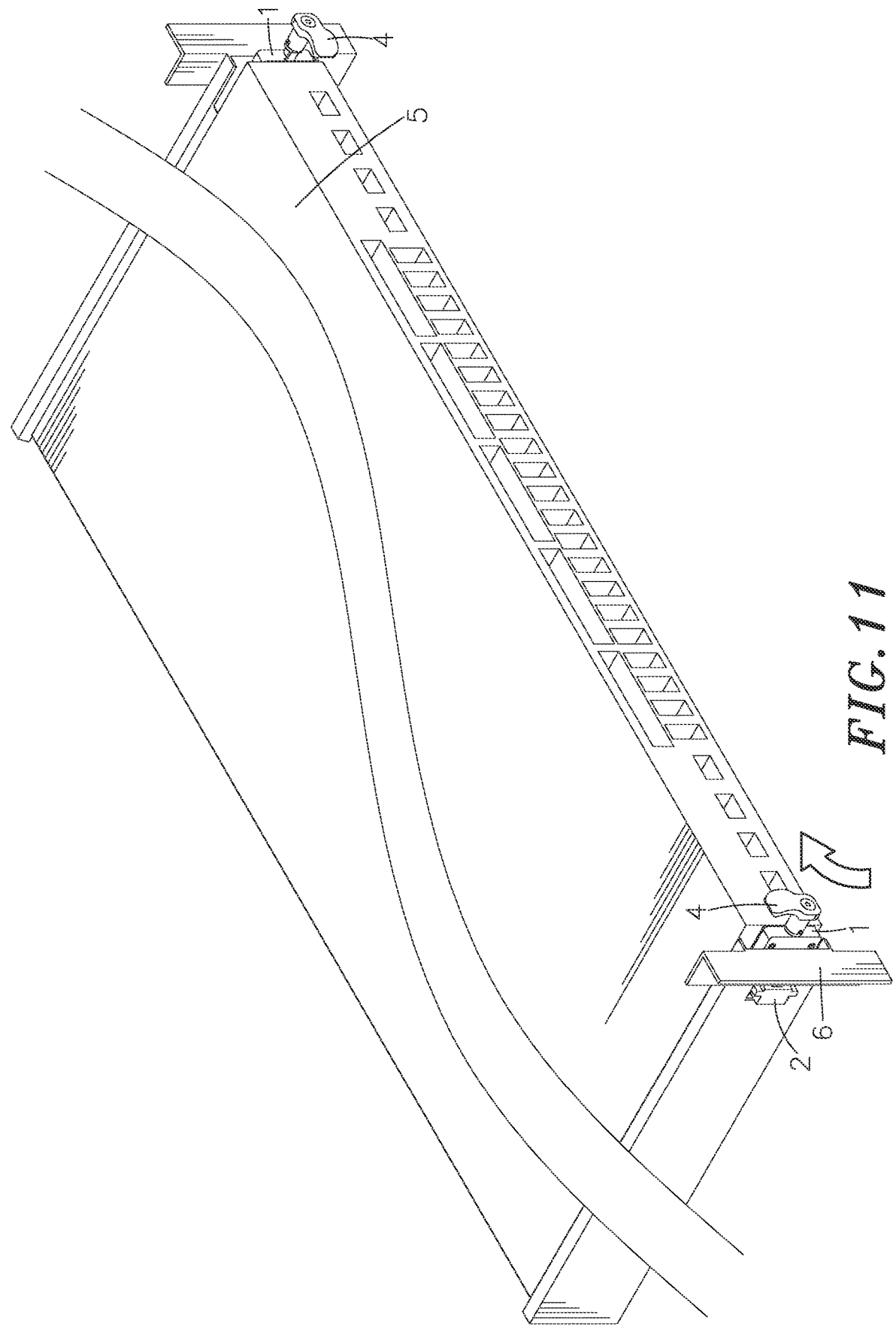
FIG. 11 is an applied view of the present invention.
Figure 12:
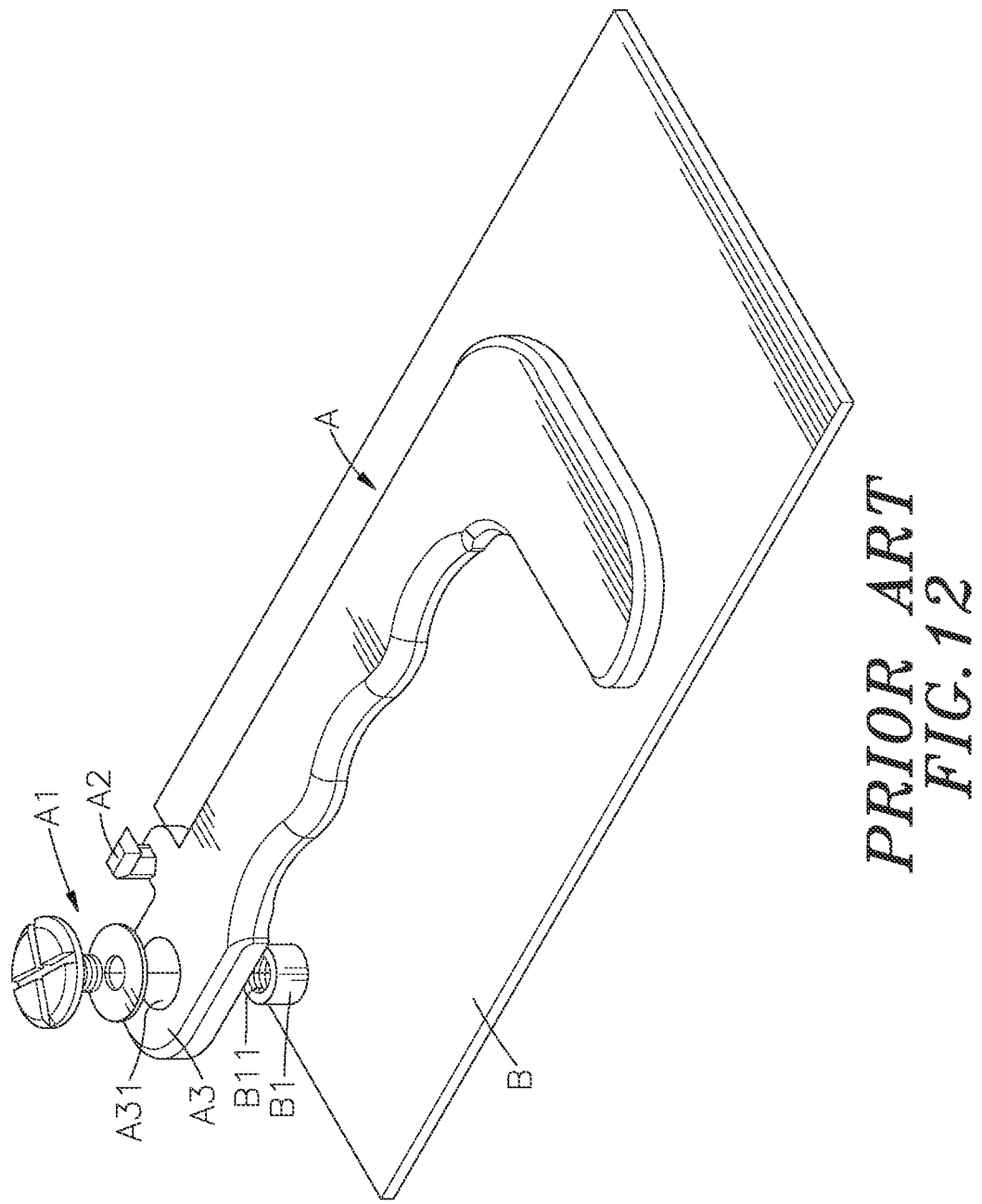
FIG. 12 is the structural diagram of the buckle structure of the conventional cabinet before assembly.

Please refer to FIGS. 6-11, where FIG. 6 is a side sectional view of the present invention in an unlocked and shifted state, FIG. 7 is a side sectional view of the present invention in a locked state, FIG. 8 is another side sectional view of the present invention in an unlocked and shifted state. FIG. 9 is another side sectional view of the present invention in a locked state, FIG. 10 is a three-dimensional schematic view of the cabinet of the present invention and FIG. 11 is an applied view of the present invention, and also refer to FIGS. 1 and 2. When the chassis quick release device of the present invention is implemented, two sets of chassis quick release devices need to be locked into the screw grooves on the left and right sides of the preset chassis 5 by using a plurality of screws exposed on the cover 12, then adjust the operating handle 4 to pull the rod body 41 away from the housing 1 and partially expose the rod body 41 to the housing 1, then the locking portion 411 can be pushed into the guide chamber 22. Through the force of the abutting edge 4111 of the locking portion 411 against the slope 221 of the guide chamber 22, the locking block 2 can be pressed down and the elastic member 23 can be compressed to form an unlocked state (as shown in FIGS. 1, 6, and 8). At the same time, after the locking portion 411 is moved from the rotating space 114 back to the guide chamber 22 of the locking block 2, the locking edge 331 of the locking member 3 lacks the resistance of the locking surface 4113 of the locking portion 411, and the rebound force of the rotary reset member 31 makes the large swing arm 32 partly rotate out of the housing 1. Next, push the rear end (where the chassis quick release devices are not assembled) of the preset chassis 5 with the assembled and unlocked chassis quick release devices into the cabinet 6 as disclosed in FIG. 10, and the large swing arm 32 of the locking member 3 protruding from the bottom side of each chassis quick release device is retracted into the rotating space 114 by the pushing force resisted by the moving groove 61, and only the inner wall surface of the resisting edge 321 at the end of the large swing arm 32 is attached to the base 11. The outer wall protruding from the resisting edge 321 of the housing 1 forms a guide rail and sticks to the surface of the moving groove 61. By using the limiting plate 62 extending obliquely from the moving groove 61 to make a resisting limit, the resisting edge 321 in the process of moving will not be derailed. The side length of the preset chassis 5 is slightly shorter than the length of the moving groove 61. Therefore, when the rear end of the preset chassis 5 is moved to the end of the moving groove 61, the locking block 2 of the chassis quick release device can just align with the locking hole 60 located on the vertical wall of the cabinet 6. Then the operating handle 4 can be pushed toward the housing 1, so that the locking portion 411 is partially pushed out of the guide chamber 22 and enters the rotating space 114, the locking block 2 is pushed by the elastic member 23 to slide out from the accommodating space 113 and snap into the locking hole 60 of the cabinet 6 to form a locked state. At the same time, after the locking portion 411 is moved from the guide chamber 22 of the locking block 2 to the rotating space 114, the locking surface 4113 of the locking portion 411 extends into the inner side of the small swing arm 33 of the locking member 3 and is held against the locking edge 331, so that the locking member 3 presents a locked state that does not swing (as shown in FIGS. 2, 7, and 9). Through the above operations, the preset chassis 5 can be quickly fixed in the cabinet 6.

Based on the above, when you want to pull out the preset chassis 5 from the cabinet 6, you only need to adjust the operating handle 4 to pull the rod body 41 away from the housing 1 and partially expose the rod body 41 to the housing 1, so that the locking block 2 retracts from the locking hole 60 of the cabinet 6 into the accommodating space 113 to form an unlocked state. At the same time, the large swing arm 32 of the locking member 3 partially rotates and protrudes from the housing 1 and the resisting edge 321 is resisted on the surface of the moving groove 61, so that the front end of the preset chassis 5 is supported by the locking member 3 to make a small lift, and the preset chassis 5 in a tilted state is easier to pull out from the cabinet 6 with force. In order to operate smoothly in the narrow cabinet 6 space, it is necessary to turn the operating portion 422 (for example: turn the operating portion 422 of the operating handle 4 on the left side of the preset chassis 5 from the direction of twelve o'clock to the direction of three o'clock; turn the operating portion 422 of the operating handle 4 on the right side of the preset chassis 5 from the direction of twelve o'clock to the direction of nine o'clock). The specific operation method of turning the operating portion 422 is as follows: Apply force to the operating portion 422 in the direction of twelve o'clock to make it rotate. The positioning block 414 before applying force is engaged with the first positioning groove 4211. In the process of rotating the operating portion 422 to the second positioning groove 4212 located at three o'clock or nine o'clock, the upper outer wall of the stepped positioning block 414 makes a frictional resistance against the inner wall of the two interference protrusions 4213 in sequence to form a segmented feel. Finally, the positioning block 414 is snapped to the second positioning groove 4212 to achieve the purpose of turning the operating portion 422 and making it easy to drag out the preset chassis 5. After the preset chassis 5 is pulled out from the cabinet 6, adjust the operating portions 422 of the operating handles 4 on both sides of the preset chassis 5 back to the twelve o'clock position and make a snap positioning (that is to move the positioning block 414 out of the second positioning groove 4212 and engage it in the first positioning groove 4211 by rotating the operating portion 422). Through the above operations, the purpose of quickly disassembling the chassis 5 from the cabinet 6 can be achieved.

From the above-mentioned disclosure of FIGS. 1 to 11, it can be understood that the main feature of the present invention is to propose a chassis quick release device combined on both sides of the preset chassis 5. The operating handle 4 of the chassis quick release device can be moved toward the housing 1, so that the locking block 2 can be stretched out and locked in the locking hole 60 of the cabinet 6, so that the preset chassis 5 can be fixed quickly with the cabinet 6. In addition, when the operating handle 4 is pulled in direction away from the housing 1, the locking block 2 is retracted from the locking hole 60 of the cabinet 6 into the accommodating space 113 to form an unlocked state, so as to quickly disassemble the preset chassis 5 from the cabinet 6. The invention is applied in the field of installation, disassembly and maintenance of computer components in the server room, and has excellent practicability, so a patent application is filed to seek the protection of the patent right.

The above description is only a preferred embodiment of the present invention, and it does not limit the scope of the patent of the present invention. Therefore, any simple modifications and equivalent structural changes made by using the contents of the description and drawings of the present invention should be similarly included in the scope of the patent of the present invention.

To sum up, the above-mentioned chassis quick release device of the present invention can indeed achieve its effect and purpose when it is used, so the present invention is an invention with excellent practicability. In order to meet the application requirements for an invention patent, an application should be filed in accordance with the law. It is hoped that the review committee will approve the case as soon as possible to protect the hard work of the inventor. If the review committee has any doubts, please do not hesitate to send a letter for instructions, the inventor will do his best to cooperate.

What the invention claimed is:

1. A chassis quick release device, comprising:
    a housing comprising a base and a cover that are capable of being combined with each other, said base comprising a sliding channel, a compression space, an accommodating space and a rotating space respectively recessed therein and a shaft protruded in said rotating space;
    a locking block combined in said accommodating space and movable linearly, said locking block comprising a guide groove and a guide chamber communicated with each other and a receiving groove accommodating at least one elastic member;
    a locking member comprising a shaft hole therein sleeved on said shaft of said housing and positioned, said locking member being provided with a rotary reset member, said rotary reset member being positioned on said shaft of said housing, said locking member comprising a resisting edge located on one end thereof and rotatably protruding from said housing and a locking edge located on an opposite end thereof opposite to said resisting edge; and
    an operating handle, said operating handle comprising a rod body and a grip, said rod body being positioned on said sliding channel, said guide groove and said guide chamber, said rod body having a locking portion abutting against said guide chamber, said grip being assembled on said rod body away from said locking portion;
    wherein when said operating handle is moved towards said housing, said locking portion partially moves out of said guide chamber and enters said rotating space, and said locking block slides out from said accommodating space under a thrust of said at least one elastic member to form a locked state; when said operating handle is pulled away from said housing, said locking portion is pushed into said guide chamber and presses down on said locking block and compresses said at least one elastic member to form an unlocked state.

2. The chassis quick release device as claimed in claim 1, wherein said base has multiple perforations and said cover has multiple locking holes, said perforations and said locking holes being for penetration and locking of multiple fasteners composed of multiple screws and multiple rivets, and the said screws being further locked into a screw groove of a preset chassis for a fixation.

3. The chassis quick release device as claimed in claim 1, wherein said operating handle further comprises a resisting plate radially extending from said rod body; said compression space of said base is further provided with a resisting wall; said housing is further provided with at least one linear reset member, each said linear reset member having one end thereof stopped against said resisting plate and an opposite end thereof held against said resisting wall to provide a reset force for said operating handle to move toward said housing, each said linear reset member being a spring.

4. The chassis quick release device as claimed in claim 1, wherein said locking block comprises at least one rail portion extending on opposite sides perpendicular to said guide groove, and said accommodating space of said base is provided with at least one sliding groove corresponding to said at least one rail portion, so that said locking block is slidable linearly in said accommodating space of said base through said at least one rail portion.

5. The chassis quick release device as claimed in claim 1, wherein said locking block is provided with at least one positioning member in an opening of said receiving groove where said locking block accommodates said at least one elastic member, a side of said at least one positioning member away from said at least one elastic member being held against an inner side of said cover, each said elastic member having one end thereof sleeved onto one respective said positioning member and an opposite end thereof stopped against a bottom side wall of said receiving groove.

6. The chassis quick release device as claimed in claim 1, wherein said guide chamber of said locking block is a double triangular space with a larger interior and a smaller exterior, and said guide chamber is further formed with a U-shaped slope at a bottom of a corresponding external triangle thereof; said locking portion accommodated in said guide chamber is correspondingly formed in a U-shaped structure with two side walls thereof in a triangular structure, and an abutting edge is formed at each of the two side walls where the two side walls contact said slope, said locking portion further comprising an abutting bump formed between the two said abutting edges and contacting an inner triangular bottom of said guide chamber, one of the two side walls that is close to said locking edge of said locking member forming a locking surface.

7. The chassis quick release device as claimed in claim 1, wherein said locking member further comprises a large swing arm with multiple turns formed between said shaft hole and said resisting edge and a small swing arm with multiple turns formed between said shaft hole and said locking edge; said locking edge is located inside one of the multiple turns of said small swing arm of said locking member.

8. The chassis quick release device as claimed in claim 1, wherein said locking member further comprises a storage chamber which divides said shaft hole into two; said rotary reset member is a torsion spring and is accommodated in said storage chamber with a center thereof for said shaft to pass through, said torsion spring having one end thereof stopped against an inner wall of said storage chamber and an opposite end thereof stopped against an inner wall of said rotating space.

9. The chassis quick release device as claimed in claim 1, wherein said rod body of said operating handle further comprises a cylindrical joint corresponding to said grip, a shaft groove located inside said cylindrical joint, a protruding annular piece formed at said cylindrical joint and a stepped positioning block formed on said annular piece; said grip is rotatable on said rod body to steer, said grip further comprising a sleeve corresponding to said cylindrical joint and an accommodating cavity located inside said sleeve, a first positioning groove and a second positioning groove located on said sleeve and engaged with said positioning block, two interference protrusions are arranged between said first positioning groove and second positioning groove, a wavy operating portion extending from said sleeve and a through groove located on a top side of said operating portion and communicating with said accommodating cavity; said operating handle further comprises an axle, said axle comprising a head accommodated in said through groove, a positioning rod extending from one side of said head and engaged in said shaft groove for a fixation, and an actuation slot located on a top side of said head for a preset hand tool to be inserted to adjust locking or unlocking.

10. The chassis quick release device as claimed in claim 9, wherein said rod body further comprises a rail plate formed between said cylindrical joint and a locking portion and extending into the sliding channel, the guide groove and the guide chamber for positioning and moving.

* * * * *